United States Patent
Walker et al.

(10) Patent No.: US 7,462,521 B2
(45) Date of Patent: Dec. 9, 2008

(54) DUAL-GATE DEVICE AND METHOD

(76) Inventors: Andrew J. Walker, 1638 Cornell Dr., Mountain View, CA (US) 94040; Maitreyee Mahajani, 20255 Knollwood Dr., Saratoga, CA (US) 95070

( * ) Notice: Subject to any disclaimer, the term of this patent is extended or adjusted under 35 U.S.C. 154(b) by 226 days.

(21) Appl. No.: 11/000,114

(22) Filed: Nov. 29, 2004

(65) Prior Publication Data
US 2006/0115939 A1 Jun. 1, 2006

(51) Int. Cl.
*H01L 21/338* (2006.01)
(52) U.S. Cl. ............... 438/176; 438/238; 438/381; 438/257; 438/951; 257/E21.304; 257/E21.645; 257/E21.646; 257/E21.623; 257/E21.658
(58) Field of Classification Search ............ 438/176, 438/181, 238, 381, 311, 257, 308, 488, 508, 438/663, 692, 680, 954, 734
See application file for complete search history.

(56) References Cited

U.S. PATENT DOCUMENTS

| | | | | |
|---|---|---|---|---|
| 5,616,934 A | * | 4/1997 | Dennison et al. | 257/67 |
| 5,633,196 A | * | 5/1997 | Zamanian | 438/653 |
| 5,894,160 A | * | 4/1999 | Chan et al. | 257/412 |
| 6,054,734 A | * | 4/2000 | Aozasa et al. | 257/315 |
| 6,140,688 A | * | 10/2000 | Gardner et al. | 257/412 |

* cited by examiner

*Primary Examiner*—David Nhu
(74) *Attorney, Agent, or Firm*—Edward C. Kwok; MacPherson Kwok Chen & Heid LLP

(57) ABSTRACT

A dual-gate device is formed over and insulated from a semiconductor substrate which may include additional functional circuits that can be interconnected to the dual-gate device. The dual-gate device includes two semiconductor devices formed on opposite surfaces of a common active semiconductor region which is provided a thickness and material sufficient to isolate the semiconductor devices from electrostatically interacting. In one embodiment, one of the semiconductor devices includes a charge storing layer, such as an ONO layer. Such a dual-gate device is suitable for use in a non-volatile memory array.

16 Claims, 13 Drawing Sheets

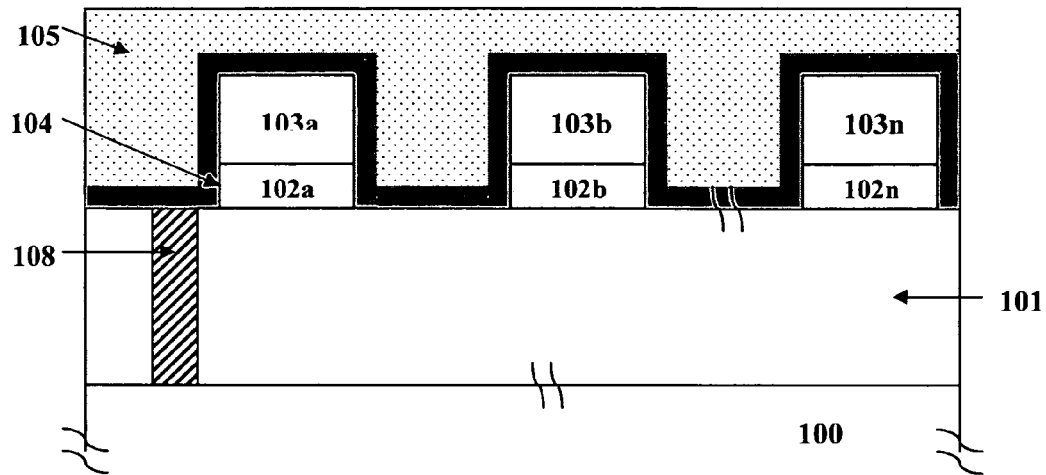
FIGURE 2C
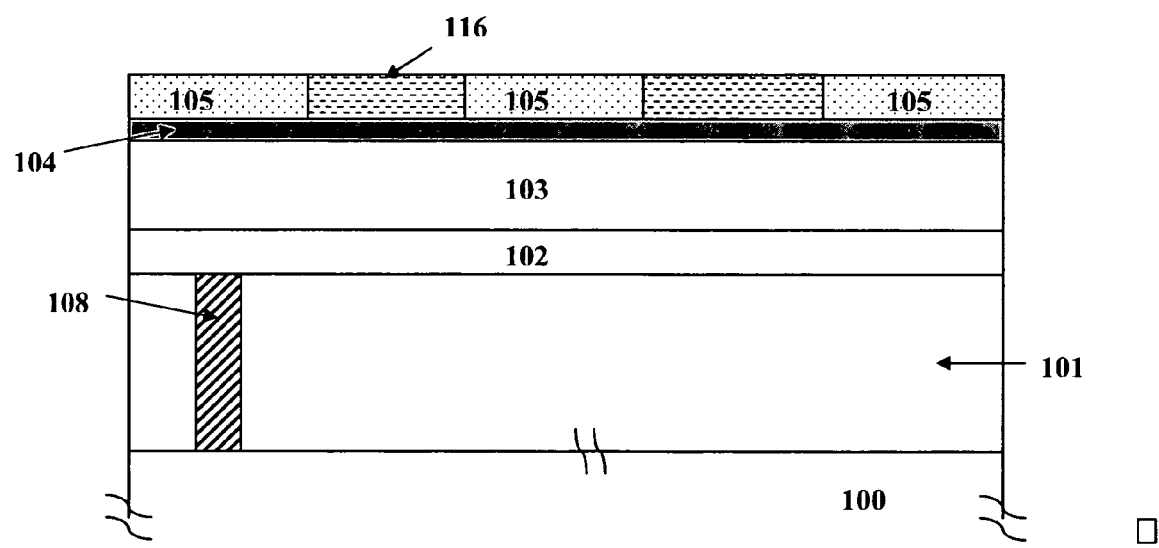
FIGURE 2D (orthogonal view)

DUAL-GATE DEVICE AND METHOD

BACKGROUND OF THE INVENTION

1. Field of the Invention

The present invention relates to a design of a semiconductor device. In particular, the present invention relates to a design of a semiconductor device having a common semiconductor active region provided between two gate electrodes.

2. Discussion of the Related Art

Dual-gate semiconductor devices have been proposed for non-volatile semiconductor memories such as NAND-type or NOR-type electrically erasable and programmable non-volatile memory ("flash memory") cells. One example of such a dual-gate flash memory cell is disclosed in U.S. Pat. No. 6,054,734 to Aozasa et al., entitled "Non-volatile Memory Cell Having Dual-gate Electrodes," filed on Nov. 5, 1997 and issued on Apr. 25, 2000. The '734 patent discloses that a dual-gate semiconductor device allows better control over its threshold voltage, particularly when the feature size is less than 0.1 µm.

A dual-gate memory cell disclosed in FIG. 4 of the '734 patent is reproduced herein as FIG. 1 to illustrate such a memory cell of the prior art. As shown in FIG. 1, dual-gate memory cell 22 includes first gate electrode 36 formed in insulating layer 26, which is supported by supporting substrate 24 (e.g., a semiconductor wafer). Insulating layer 32—which includes a silicon nitride charge storage layer formed as a part of an oxide-nitride-oxide (ONO) multilayer structure—forms an insulating layer between first gate 36 and active semiconductor region 30. Active region 30 may be formed using mono-crystalline silicon. Second gate electrode 38 is formed on the other side of active region 30 and is insulated from active region 30 by gate insulating layer 34. Source-drain regions 40 and 42 are provided at the periphery of active region 30, which may be interconnected with other circuitry on the same substrate through interconnection layers 44 and 46.

Dual-gate memory cell 22 thus constitutes a combination of a memory device, controlled by first gate electrode 36, and a non-memory device, controlled by second gate electrode 38. Typically, gate electrode 36 is coupled to a word line, and source-drain regions 40 and 42 are coupled by interconnection material 44 and 46 to the bit line and a source reference voltage. Programming and erasing of dual-gate memory cell is achieved by applying predetermined voltage levels across the word line coupled to first gate electrode 36 and the bit line and the reference voltage coupled to source-drain regions 40 and 42. In dual-gate memory cell 22, the programmed state of the memory device affects the threshold voltage of the non-memory device. The '734 patent teaches using this electrostatic interaction to "read" or detect the programmed state of the memory cell. Specifically, the '734 patent teaches providing active region 30 to be on the order of the depletion layer thickness of the memory device, such that the threshold voltage of the non-memory device depends on whether or not the memory device is in an erased state or a programmed state.

A NAND-type memory circuit is typically organized using strings of memory cells ("NAND strings"), with each NAND string being formed by serially connecting the source-drain regions of a number of the memory cells between a bit line and a source line. Dual-gate memory cell 22 is not entirely satisfactory as a building block for forming such NAND strings in a memory circuit. This is because, to program such a string, in addition to applying the programming voltage to the memory cell to be programmed, the word line of each non-selected memory cell is required to be biased to an intermediate voltage ("program pass voltage") so that active region 30 in each of the non-selected memory cells is conducting. The conducting non-selected memory cells allow source-drain regions 40 and 42 of the selected memory cell to be properly biased. This program pass voltage is carefully chosen in the window between the programming voltage and zero volts to avoid modifying the programmed state of the non-selected memory cells to any extent. The non-selected dual-gate memory cells in the NAND strings are thus susceptible to "program disturb", as a result of the program pass voltage imposed at their gate electrodes.

The non-memory device (i.e., the device controlled by gate electrode 38) may be used either alone or in conjunction with the memory device (i.e., the device controlled by gate electrode 36) to ensure that active region 30 is conducting in each of the non-selected memory cells. The electrical interaction between the devices on opposite surfaces of active region 30, however, causes "program disturb" in the non-selected dual-gate memory cells of the NAND string.

Similarly, during a read operation, active region 30 of each non-selected dual-gate memory cell in such a NAND string is also rendered conducting by applying a "read pass voltage" to the gate electrodes of the non-memory devices. The resulting electrostatic interaction between the two devices on opposite faces of active region 30 disturbs the stored charge in the non-selected memory devices ("read disturb").

In the prior art, program/read verify schemes, such as those taught in the '734 patent for the dual-gate NAND string (and also for standard single-gate NAND strings) are devised to ensure that the programmed memory cell is charged to reach a well-defined minimum threshold voltage above the distribution of erased threshold voltages and to ensure that no memory cell in the NAND string is programmed beyond a well-defined maximum threshold voltage. In this manner, during subsequent read operations, a relatively low "read pass voltage" may be used to allow the non-selected devices to conduct. Program/read verify schemes often utilize a combination of time-consuming read operations and applications of multiple programming pulses. These activities limit the "program bandwidth" (i.e., the rate at which a memory chip can be programmed).

The '734 patent requires the effect of stored charge in the memory device to be read out as a change in the threshold voltage of the opposite non-memory device. While this method certainly reduces one component of read disturb, it also reduces the effective threshold voltage window between programmed and erased states to less than half of what it would have been if the threshold voltage of the memory device itself is measured in the read operation.

The three methods outlined in the '734 patent to form the dual-gate device and, in particular, the thin active region 30 with source and drain regions 40 and 42, include (1) "bonding SOI", (2) a technique based on lateral epitaxial growth from the substrate as seed, and (3) a technique based on implantation. Such techniques are relatively expensive and do not allow stacking additional memory cell layers in three dimensions. Thus, a memory circuit based on dual-gate memory cell 22 of the '734 patent is limited in the circuit density it can achieve.

Furthermore, the above methods constrain peripheral circuitry to the same layer as the memory cells and result in the substrate acting purely as a mechanical support, thus further limiting the circuit density that can be achieved.

Thus, it is desired to have a high density memory device using a dual-gate structure which can achieve a high circuit density, and which, when used in the context of a non-volatile memory cell, is less susceptible to the disadvantages of program and read disturbs and reduces the need for time-consuming program/read verify schemes.

SUMMARY OF THE INVENTION

The present invention provides a dual-gate device and a method for forming such a dual-gate device. According to one embodiment, a dual-gate device is formed over and insulated from a semiconductor substrate which may include additional functional circuits that can be interconnected to the dual-gate device. The dual-gate device includes two semiconductor devices formed on opposite surfaces of a common active semiconductor region. By virtue of its thickness and its material property, the active semiconductor region isolates the semiconductor devices from electrostatically interacting. In one embodiment, one of the semiconductor devices includes a charge storing layer, such as an ONO layer or a dielectric layer which includes a floating gate. Such a dual-gate device is suitable for use as a building block in a non-volatile memory array.

According to one embodiment of the present invention, the active semiconductor region may include a polycrystalline semiconductor material, such as polysilicon, or an amorphous semiconductor material. The polycrystalline material may be obtained, for example, by crystallizing an amorphous semiconductor material using, for example, heat treatment or laser treatment.

According to one embodiment of the present invention, multiple dual-gate devices disclosed herein may be used in a NAND string of a non-volatile memory device. During programming of such a NAND string, the "program pass voltage" is only applied to the gates of the non-memory devices associated with the non-selected dual-gate devices while the programming voltage is applied to the gate of the memory device of the selected dual-gate device. When a memory cell in such a NAND string is read, the "read pass voltage" is only applied to the gates of the non-memory devices associated with the non-selected dual-gate devices, while the non-memory device associated with the selected dual-gate device is turned off. Conduction through a non-selected dual-gate device during a programming or a read operation is provided by the non-memory access device, which has a threshold voltage that is not affected by the programmed state of the associated memory device. Because the memory devices of the non-selected dual-gated devices are not involved in the programming and read operations, the deleterious effects of program disturb and read disturb on the dual-gate memory cells are greatly reduced.

The present invention is better understood upon consideration of the detailed description below and the accompanying drawings.

BRIEF DESCRIPTION OF THE DRAWINGS

FIGS. 2A-2E illustrate a process suitable for forming a non-volatile memory device organized as NAND-strings, using dual-gate memory cells according to one embodiment of the present invention.

To facilitate cross reference between features in these figures, like reference numerals are assigned to like elements,

DETAILED DESCRIPTION OF THE PREFERRED EMBODIMENTS

The present invention provides a dual-gate semiconductor device that may be used to create three-dimensional circuit structures to achieve a high circuit density. In addition, a dual-gate semiconductor device of the present invention, when used as non-volatile memory cell ("dual-gate memory cell"), experience only limited program and read disturbs.

FIGS. 2A-2E illustrate a process suitable for forming a non-volatile memory device organized as NAND-strings, using dual-gate memory cells according to one embodiment of the present invention. Although the embodiment illustrated in FIGS. 2A-2E is provided in the context of a non-volatile memory device, the present invention is not so limited. The present invention can be used, for example, to form a logic circuit.

Figure 1:
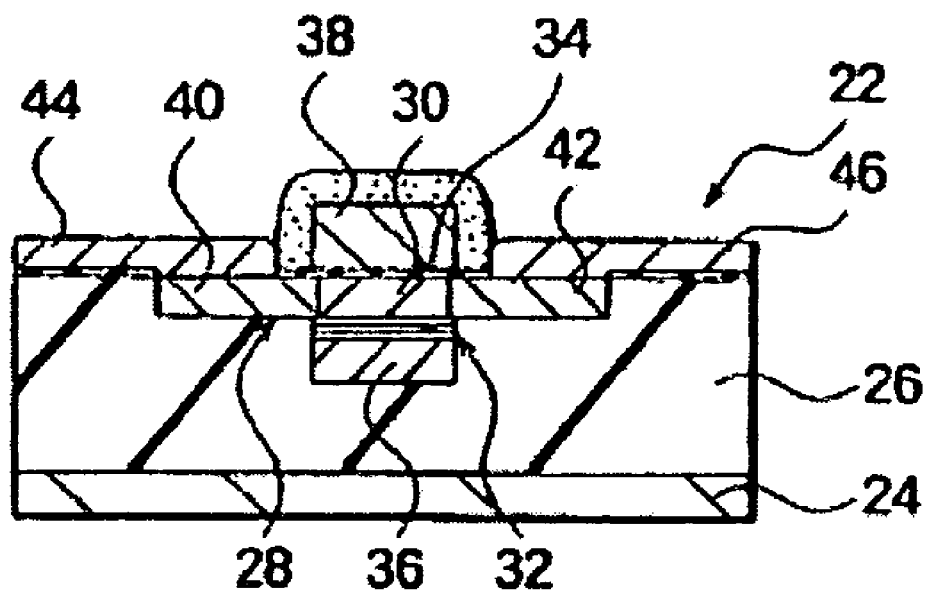
FIG. 1 shows dual-gate memory cell 22 of the prior art.
Figure 2A:
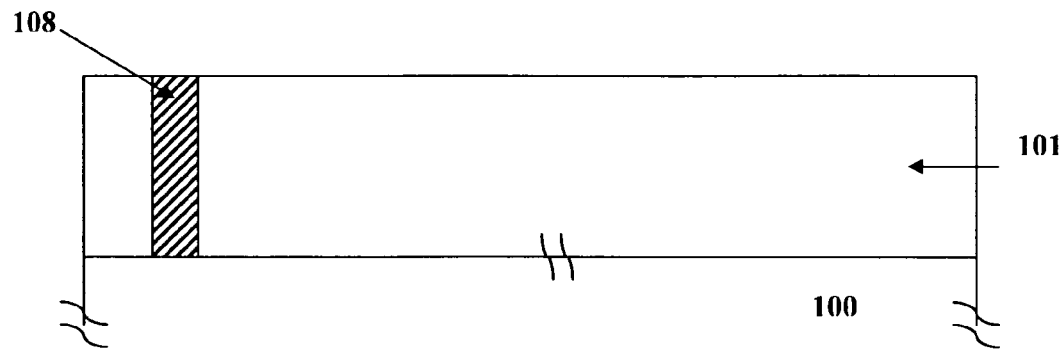

As shown in FIG. 2A, insulating layer 101 (e.g., a deposited silicon oxide) is provided on substrate 100. Substrate 100 may be a semiconductor wafer including, for example, peripheral circuits found in a conventional memory device. Insulating layer 101 may be planarized using a conventional chemical mechanical polishing (CMP) process. Insulating layer 101 may also be patterned using a conventional photolithographical process to form conducting "plugs" 108 to allow interconnecting the peripheral circuits in substrate 100 with the dual-gate devices to be formed. A suitable photolithographical process may include, for forming interconnection to the peripheral circuits in semiconductor substrate 100, anisotropic etching (e.g., reactive ion etching) at this or a later step, one or more metal layer depositions, and subsequent CMP steps.

Next, a conductor layer 102 is provided on insulating layer 101 using a conventional method (e.g., by deposition). Suitable materials for conductor layer 102 include metals (e.g., a refractory metal, such as tungsten (W), tantalum (Ta) or titanium (Ti)), metal nitrides (e.g., tungsten nitride (WN), titanium nitride (TiN), or tantalum nitride (TaN)), metal silicides (e.g., cobalt silicide ($CoSi_2$), nickel silicide (NiSi), or titanium silicide ($TiSi_2$)), or highly doped semiconductor materials. Conductor layer 102 provides a highly conductive path to the first of the two devices in the dual-gate memory cells of the present embodiment. The appropriate thickness of this layer may be determined according to the required sheet resistivity (ρ) of the material. One skilled in the art will recognize that some of the appropriate materials for conductor layer 102 may also require adhesion layers or barrier layers. Such adhesion layers or barrier layers are understood to be also provided in this step, where necessary.

Subsequent to providing conductor layer 102, a highly doped (p-type or n-type) polysilicon layer 103 is provided. Conductor layer 102 and polysilicon layer 103 are then patterned to form the first gate electrodes for the dual-gate memory cells in this embodiment of the present invention (e.g., first gate electrodes 102a/103a, 102b/103b . . . 102n/103n, see FIG. 2B) using a conventional photolithographical patterning technique. In this embodiment, the dual-gate memory cell includes a memory device and a non-memory device ("access device").

Figure 2B:
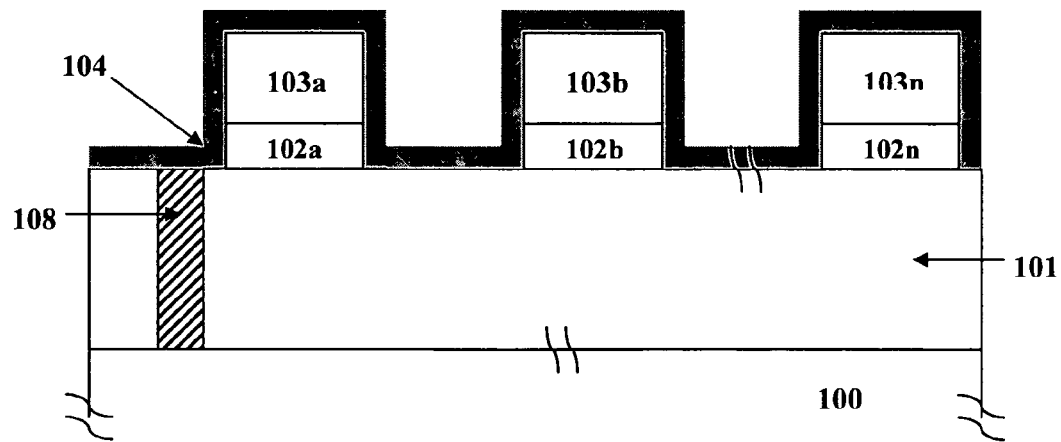

Next, first gate dielectric layer 104 is provided using a suitable conventional technique. In this embodiment, as first gate dielectric layer 104 is a part of the access device, gate dielectric layer 104 may be provided by a silicon oxide layer (e.g., $SiO_2$) or a high K dielectric material (i.e., K>3.9). The thickness of gate dielectric layer 104 depends on the device dimensions, the gate voltages used, and the desired threshold voltage ($V_T$) of the access device. A suitable thickness for many applications may be between 10 Å to 200 Å. If a silicon oxide is used for first gate dielectric layer 104, the silicon oxide may be grown using conventional furnace or rapid thermal processing (RTP) oxidation methods. Alternatively, gate dielectric layer 104 may be deposited using conventional low pressure chemical vapor deposition (LPCVD) or atomic layer deposition (ALD) techniques. The resulting structure is shown in FIG. 2B.

Next, active device layer 105 is provided using a conventional deposition technique, such as LPCVD, chemical vapor deposition (CVD) or physical vapor deposition (PVD). Active device layer 105 provides a channel forming layer for both devices of the dual-gate device. Active device layer 105 may be amorphous silicon, polycrystalline silicon or another semiconductor material (e.g., germanium (Ge) or silicon-germanium (SiGe)). The thickness of this layer may be between 50-3000 Å. If polysilicon is used, for an NMOS device, active device layer 105 may be doped in situ or by ion implantation to a p-type dopant (e.g., boron) concentration of $10^7$ $cm^{-3}$. (Naturally, for a PMOS transistor, n-type dopant, such as phosphorus, may be used.) If first deposited as an amorphous silicon layer, active device layer 105 may be subsequently crystallized using laser or heat treatment.

Next, an oxide-nitride (ON) composite layer 106 may be provided as a chemical-mechanical polishing (CMP) stop using a conventional plasma-enhanced CVD (PECVD), LPCVD, PVD or CVD technique. While not required for the device, ON layer 106 simplifies the manufacturing process.

Active device layer 105 and ON composite layer 106 are then patterned to form the channel forming regions, using conventional photolithographical and etching techniques. In general, the patterned lines of active layer 105 and ON layer 106 run perpendicularly to first gate electrodes 102a/103a, 102b/103b, . . . 102n/103n).

Next, a dielectric material 116 (e.g., $SiO_2$, fluorinated silicon glass (FSG) or a low K material) is deposited to fill in the spaces between the lines of active device layer 105. Dielectric material 116 may be provided using high density plasma (HDP) CVD, CVD, PECVD, PVD or spun on. The surface is then planarized using a CMP step with ON composite layer 106 acting as a stop. Both layers in ON composite layer 106 may be removed using, for example, a conventional wet process. The resulting structure is shown in two orthogonal views in FIGS. 2C and 2D. FIG. 2D is a cross section through one of the gate electrode lines 102/103 (e.g., gate electrode 102a/103a).

Next, a thin dielectric layer (e.g., silicon dioxide, between 15-80 Å) is provided using a conventional technique. In this embodiment, the second device in the dual-gate memory cell of this embodiment of the present invention is the memory device. Thus, over the thin dielectric layer is further provided a charge trapping layer and a blocking dielectric layer (e.g., silicon dioxide). The thin dielectric layer, the charge trapping layer and the blocking dielectric layer are collectively referred to as second dielectric layer 107 in the remainder of this detailed description. Suitable charge trapping and blocking dielectric layers are silicon nitride and a $SiO_2$ layer, respectively. Instead of silicon nitride, nano-crystals (i.e., very fine islands of conductive material), or ferroelectric material may also be used for the charge trapping layer. Alternatively, a floating gate electrode (e.g., doped silicon) may also be used.

Next, polysilicon layer 109 and conductor layer 110 are formed and patterned to form second gate electrode layer 109/110, using substantially the same techniques as discussed above with respect to polysilicon layer 103 and conductor layer 102. In general, the patterned lines of second gate electrode layers 109a/110a, 109b/110b, . . . , 109n/110n run perpendicular to the lines of active device layer 105, and parallel to the lines of first gate electrode layers 102a/103a, 102b/103b, . . . 102n/103n).

Source-drain regions 111 may then be formed using a conventional ion implantation technique for an appropriate dopant, such as phosphorus, arsenic or antimony for an n-type species (this embodiment) or boron for a p-type species, when the dual-gate device consists of PMOS transistors. For both n-type and p-type dopants, source-drain region 111 may be doped to a concentration between $10^{19}$ $cm^{-3}$ and $10^{21}$ $cm^{-3}$.

Next, dielectric material layer 112 (such as $SiO_2$, fluorinated silicon glass (FSG) or a low K material) is deposited to fill in the spaces between the lines of second gate electrode layer 109/110. Dielectric material layer 112 may be provided in the same manner as described above with respect to the materials disclosed. The surface may then be planarized using a conventional CMP technique.

Vias 113 are then formed to contact the different regions of the dual-gate device (i.e., first electrodes 102a/103a, 102b/103b, . . . , 102n/103n, source-drain region 111, second electrodes 109a/110a, 109b/110b, . . . , 109n/110n), using conventional photolithography and etching techniques. Etching may be tailored to stop on polysilicon layers 102 and 109, active device layer 105 (at the portions implanted with source-drain dopants), or the conductor layers 102 and 110.

Figure 10:
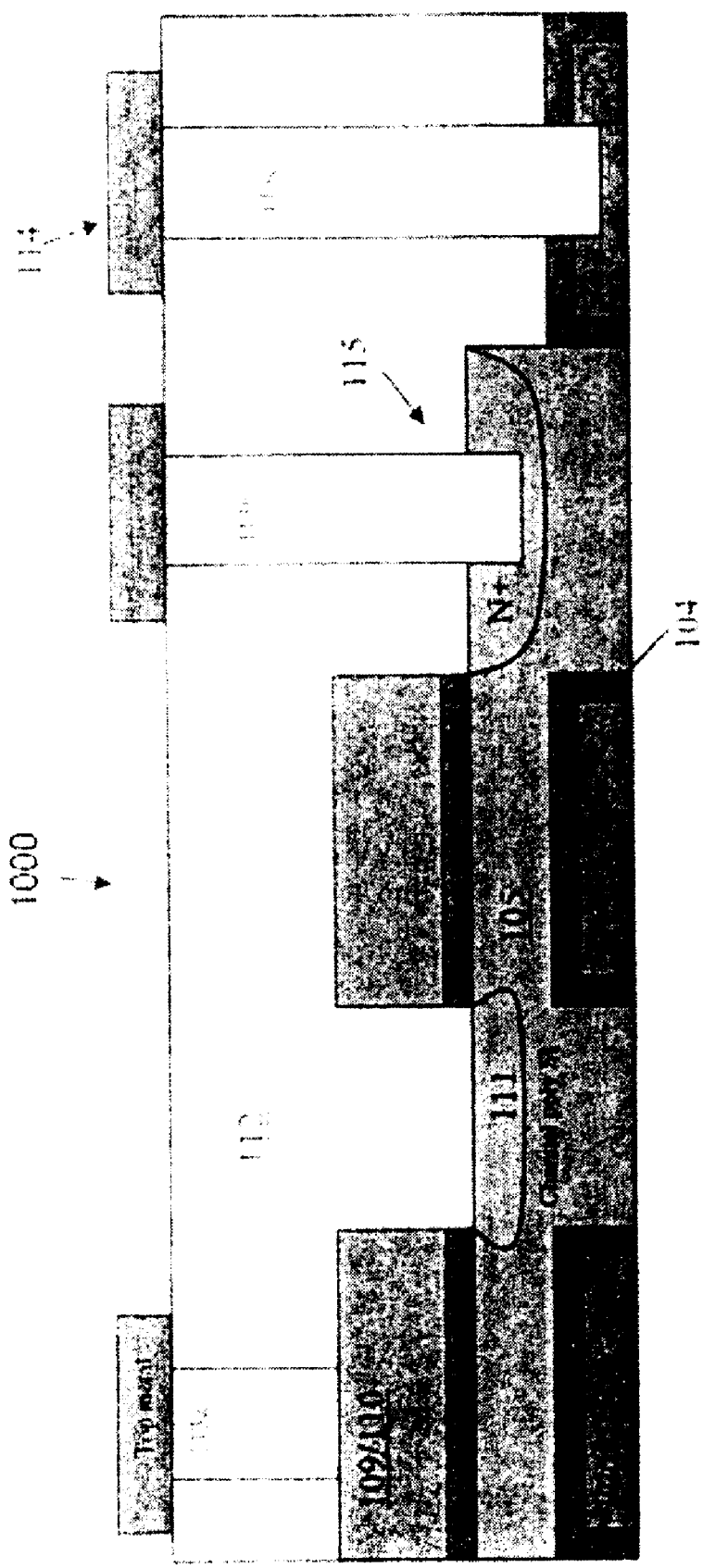
FIG. 10 further illustrates, by a cross section of the device structure, a suitable via scheme in accordance with one embodiment of the present invention.

FIG. 10 further illustrates, by a cross section 1000 of the device structure, the via scheme used in accordance with this embodiment of the present mv ention. As shown in FIG. 10, landing pads for bit line vias (e.g., bit line via 113b for landing pad 115) are formed between adjacent lines of first gate electrode layer 102/103. The width of landing pad 115 is preferably less than two times the thickness of a ctive device layer 105 at the channel regions. The built-in topography allows ample polysilicon material in active device layer 105 for the via-etch step to etch through dielectric layer 112 to form bit line via 113b. As active device region is typically 200-2000 Å thick, the topography allows the bit line landing pad thickness to be effectively the sum of the thickness of a ctive device region 105 and the height of first gate electrode layer 102/103. This landing pad thickness significantly reduces the risk of the via etch punching through the thin active device region 105 and also allows vias 113 to be formed to different depths in a single process step. The p-type polysilicon layer 103 of first gate electrode layer 102/103 is etched to contact down to conductor layer 102, so that the via fill material, such as doped silicon, tungsten, aluminum or copper, is directly in contact with conductor layer 102 to minimize resistance. A plug implant can be performed prior to via fill deposition to ensure good contact. Such an implant is especially beneficial for bit line via 113b, for example.

Figure 2E:
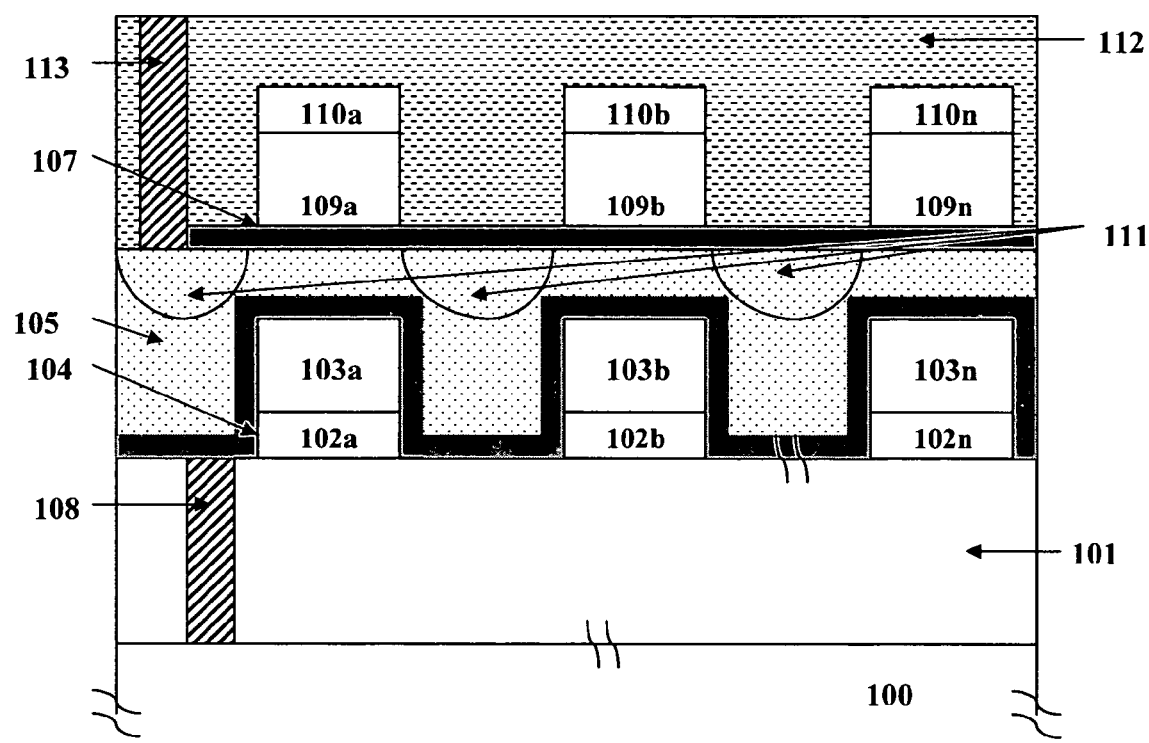

Via formation completes after a CMP step or a plasma tech step. The resulting structure is shown in FIG. 2E. Conductor layer 114 may be provided for interconnecting the devices thus formed.

Figure 3A:
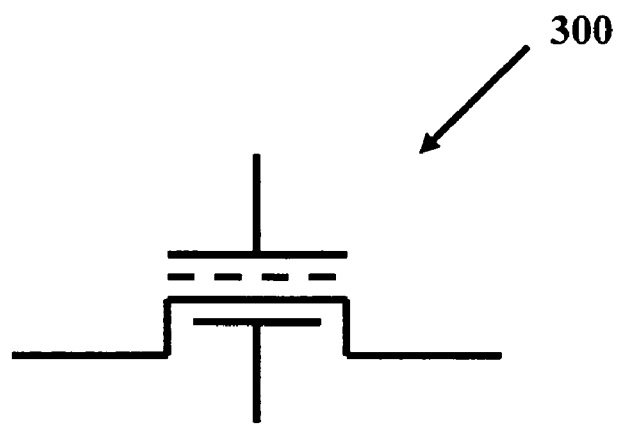
FIG. 3a shows a symbol representing a dual-gate memory cell of the present invention.
Figure 3B:
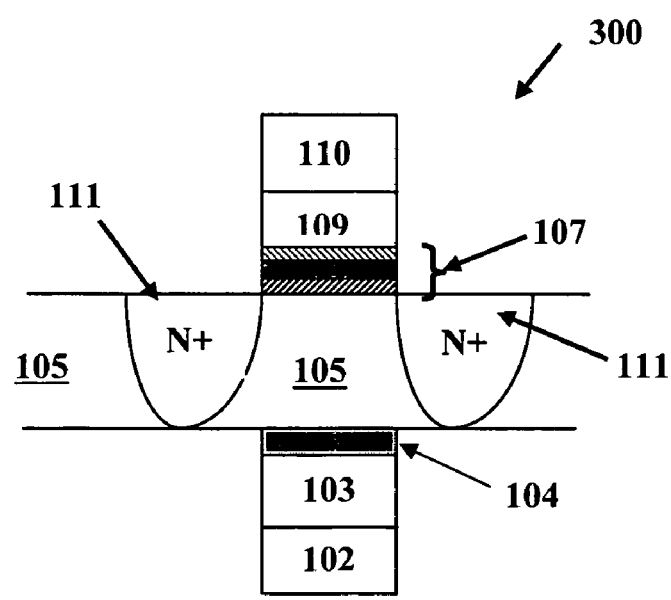
FIG. 3b shows a structural schematic representation of a dual-gate memory cell according to one embodiment of the present invention.

Layers 101-110 therefore embed dual-gate memory cells formed by first and second gate electrodes layers 102/103 and 109/110, first and second gate dielectric layers 104 and 107, and active device layer 105. That is, a dual-gate memory cell is formed including (a) an access device formed by first gate electrode layer 102/103, first gate dielectric layer 104 and active device layer 105, and (b) a memory device formed by second gate electrode 109/110, second gate dielectric layer 107 and active device layer 105. This dual-gate memory cell is represented by the symbol 300 of FIG. 3a and structural schematically in FIG. 3b.

Figure 6:
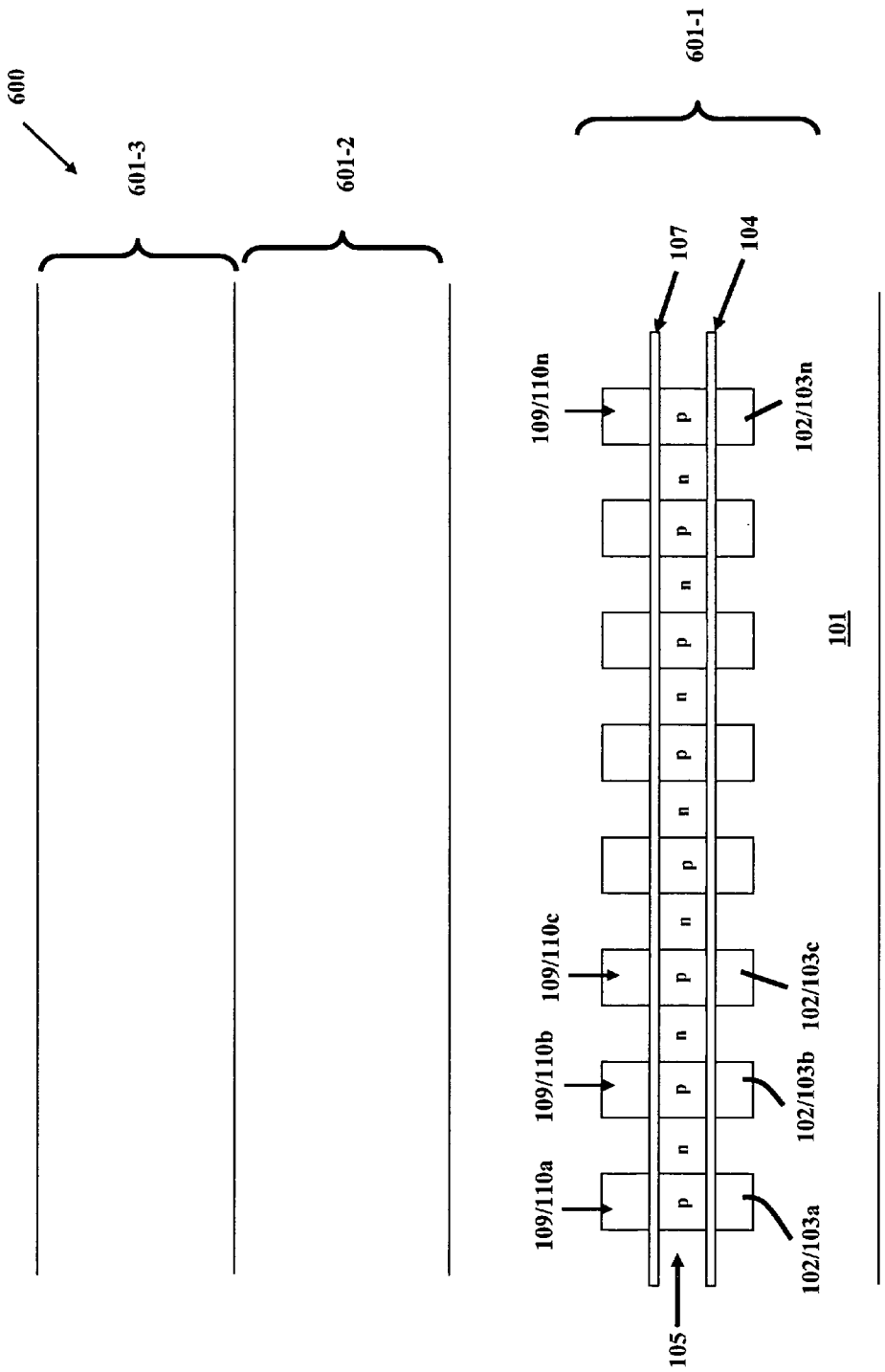
FIG. 6 shows structure 600, which is achieved by repetitive application of the processing steps illustrated by FIGS. 2B-2F, in accordance with one embodiment of the present invention.

The steps illustrated by FIGS. 2B-2E may be repeated to form additional layers of dual-gate memory cells. The resulting structure is shown, for example, as structure 600 in FIG. 6. As shown in FIG. 6, structure 600 includes a stack of three blocks of dual-gate memory cells 601-1, 601-2 and 601-3, with each block of dual-gate memory cells having the structures of layers 101-110 shown in FIG. 2D.

Although each dual-gate memory cell illustrated by FIGS. 2A-2E has the memory device formed away from substrate 100 (relative to the access device), the dual-gate memory cell may also be formed under a difference orientation, i.e., having the memory device formed closer to substrate 100, by providing a charge trapping dielectric layer in first gate dielectric layer 104 and a non-storage intended dielectric layer as second gate dielectric layer 107. Regardless of which orientation is used, the memory and access devices of the dual-gate cell operate and perform in the same manner. Also, although the charge storage layer in embodiment of FIGS. 2A-2E is an ONO type dielectric layer, other forms of electrically erasable and programmable structures, such as floating gate or ferroelectric material, may also be used. Such structures may be made using conventional techniques, such as those disclosed in the '734 patent.

Of importance is that active layer 105 is provided a thickness intended to minimize electrostatic interaction between the memory device and the access device of the dual-gate memory cell. With this arrangement, the threshold voltage of the access device becomes independent of the programmed state of the memory device. Polycrystalline or amorphous semiconductors (e.g., polysilicon) are particularly suitable to provide active device layer 105, as localized states can exist in the band gap for these materials which result in a shielding effect that isolates the memory device from the access device. Accordingly, a dual-gate memory cell in a NAND string may be programmed and read in the manner described next with respect to NAND string 400 of FIG. 4.

Figure 4A:
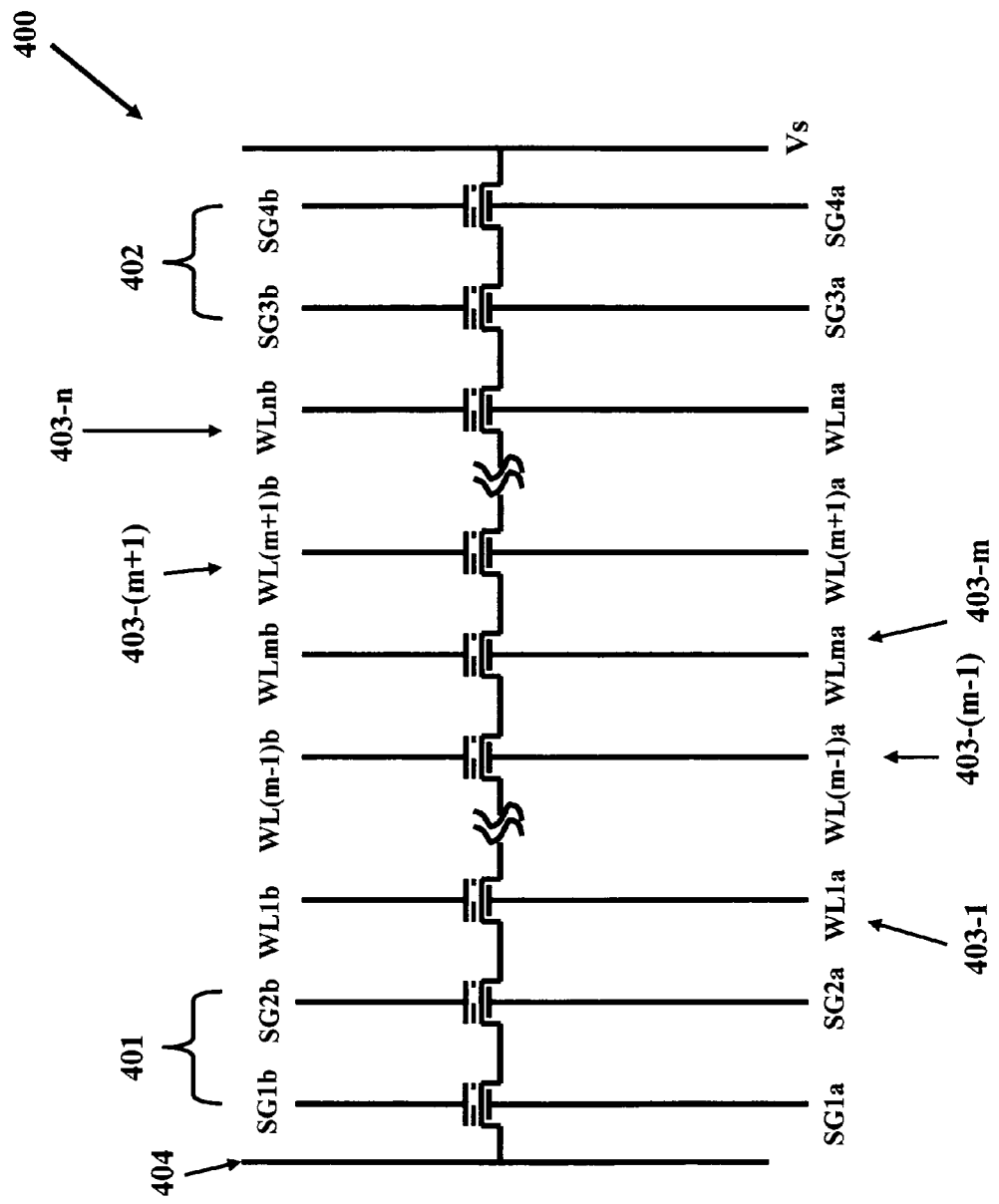
FIG. 4a shows NAND string 400 in a circuit schematic representation including a number of dual-gate memory cells, according to one embodiment of the present invention.
Figure 4B:
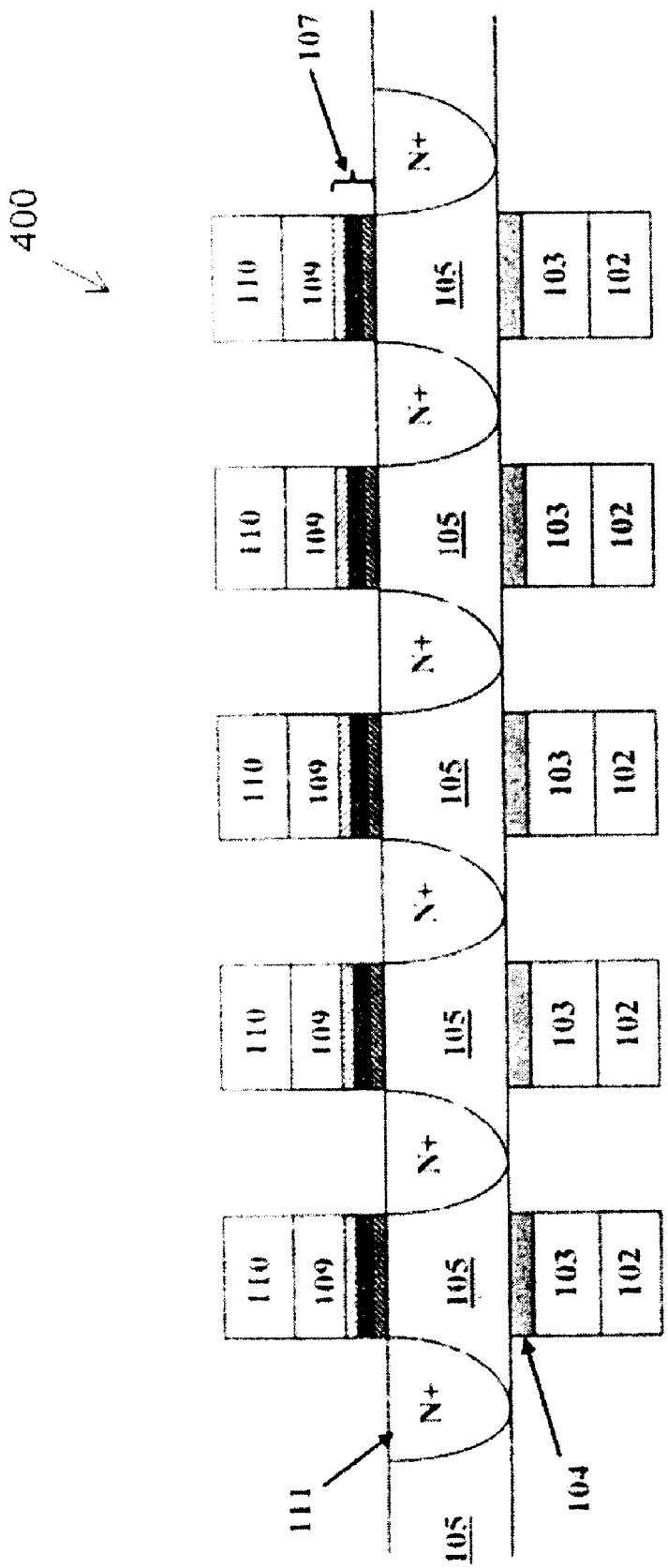
FIG. 4b shows a portion of NAND string 400 of FIG. 4a in a structural schematic representation.

FIGS. 4a and 4b shows NAND string 400, which includes a number of dual-gate memory cells, in a circuit schematic diagram and a structure schematic diagram, according to one embodiment of the present invention. As shown in FIG. 4a, NAND string 400 includes (a) one or more sets of select devices 401 and 402, which may be formed also by dual-gate memory cells, as is shown in FIG. 4, and (b) a number of dual-gate memory cells 403-1 to 403-n. The gate electrodes of the memory devices are coupled to a first set of word lines (indicated by signals SG1b-SG4b, WL1b, WL2b, . . . WLnb) and the gate electrodes of the access devices are coupled to a second set of word lines (indicated by signals SG1a-SG4a, WL1a, WL2a, . . . , WLna).

To program dual-gate memory cell 403-m, for example, the memory device of dual-gate memory cell 403-m is the only memory device in the NAND string that is made conducting. In this embodiment, a memory cell is programmed by applying of a large positive voltage (e.g., between 8 volts to 17 volts) to the associated word line (e.g., WLmb for memory cell 403-m) and connecting the conducting channel to a ground or close to ground potential. Such a potential may be provided, for example, from the bit line by applying a "program pass voltage" (e.g., between 4 volts and 13 volts) to the gate electrode of each access devices between bit line 404 and the memory cell to be programmed, thereby rendering the access devices conducting. In FIG. 4, the gate electrodes of the conducting access devices receiving the program pass voltage are SG1a, SG2a, WL1a, WL2a, . . . WL(m−1)a. At the same time, gate electrodes WL1b, WL2b, . . . WL(m−1)b of the corresponding memory devices are either left floating or held at a potential that makes these memory devices non-conducting. The memory devices of dual-gate select devices 401 may be set to conducting or non-conducting. The "program pass voltage" may be applied to gate electrodes WL(m+1)a, WL(m+2)a, . . . WLna of dual-gate memory cells 403-(m+1), 403-(m+2), . . . , 403-n to reduce program disturb in the memory devices of other non-selected NAND strings that receive the signal on word line WLmb. During programming, the access device of dual-gate memory cell 403-m may be made conducting or non-conducting. The active silicon between the last dual-gate memory cell 403-n and the ground reference voltage $V_s$ is made non-conducting during programming by applying appropriate voltages to gate electrodes SG3b, SG4b, SG3a and SG4a such that no conduction path is formed.

When dual-gate memory cell 403-m is read, for example, gate electrode WLmb of dual-gate memory cell 403-m is the only gate electrode provided a read voltage. The read voltage is a voltage in the voltage window between the erased and the programmed state threshold voltages of the memory device (e.g., between 0 volts and 2 volts). The memory device of dual-gate memory cell 403-m conducts in the erased state and does not conduct in the programmed state. The gate electrode WLma of the access device in dual-gate memory cell 403-m is applied a voltage to render the access device non-conducting. At the same time, gate electrodes WL1a, WL2a, . . . , WL(m−1)a, WL(m+1)a, WL(m+2)a, . . . , VWLna of dual-gate memory cells 403-1, 403-2, . . . , 403-(m−1), 403-(m+1) . . . , 403-n are applied a "read pass voltage" to make their associated access devices conducting, while the gate electrodes of the corresponding memory devices are either left floating or are held at a voltage that renders these memory devices non-conducting. The read pass voltage may be a voltage between 2 volts and 8 volts. In addition, select devices 401 and 402 are made conducting to provide a conducting path between bit line 404 and ground reference voltage $V_s$ by applying appropriate voltages to gate electrodes SG1a, SG2a, SG1b, SG2b, SG3a, SG4a, SG3b, SG4b.

Because the memory devices in the non-selected dual-gate memory cells are inactive during both the read and the programming operations, deleterious read and program disturb effects are limited.

Figure 5:
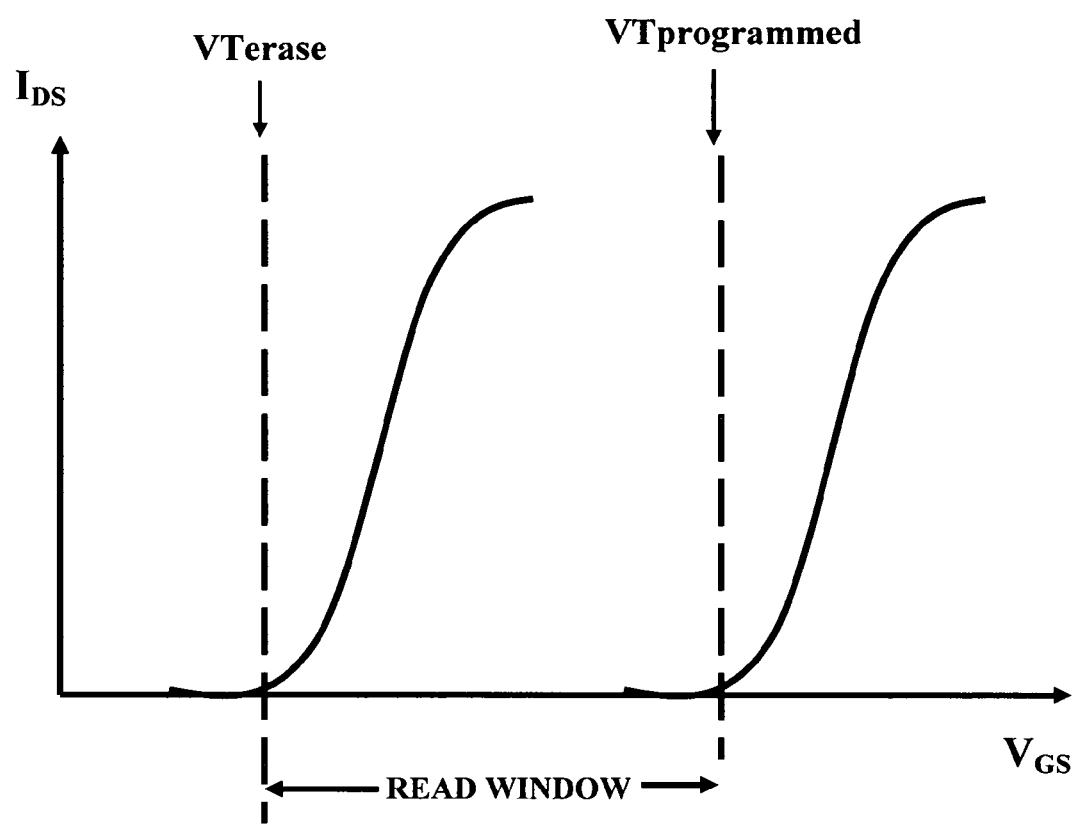
FIG. 5 shows the expected drain-source currents IDS versus the voltage at the gate terminal of the memory device of a dual-gate memory cell of the present invention.

FIG. 5 shows the expected currents IDS between bit line 404 and ground reference voltage Vs versus the voltage of gate electrode WLmb of the memory device of selected dual-gate memory cell 403-*m*. (Select devices 401 and 402, and the access devices of dual-gate memory cells 403-1, 403-2, ..., 403-(m−1), 403-(m+1), ..., 403-*n* are conducting). As shown in FIG. 5, if the memory device of dual-gate memory cell 403-*m* is in the programmed state, an applied read voltage within the read window (i.e., greater than the threshold voltage of a memory device in the erased state, but less than the threshold voltage of the memory device in the programmed state) results in a substantial current $I_{DS}$. Conversely, if the memory cell is in the programmed state, the applied voltage within the read window results in significantly less current $I_{DS}$.

Figure 7:
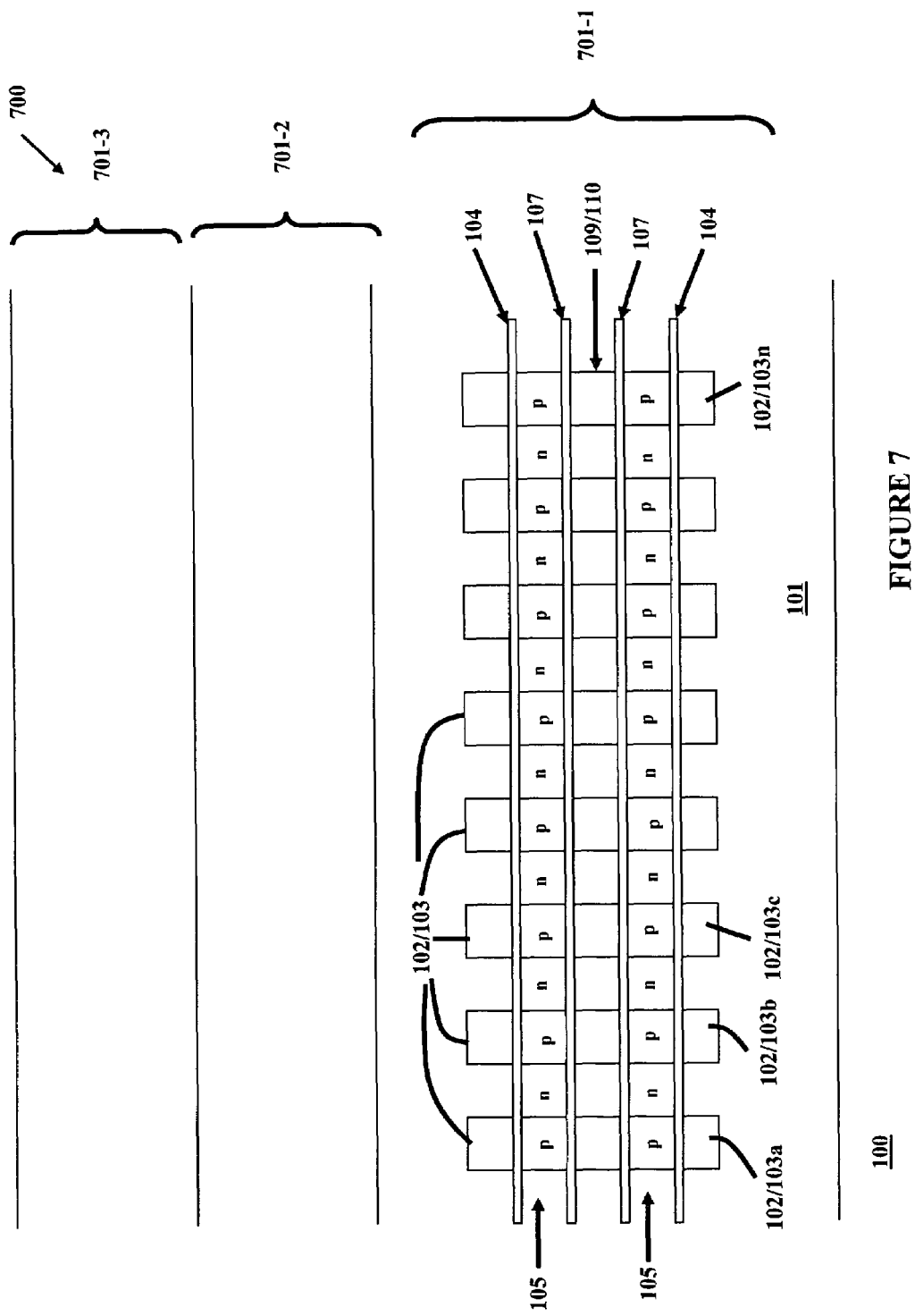
FIG. 7 shows structure 700 which includes charge storing gate dielectric layers 107 on both sides of gate electrode layer 109/110 (i.e., using the same gate electrode to control more than one memory device).
Figure 8:
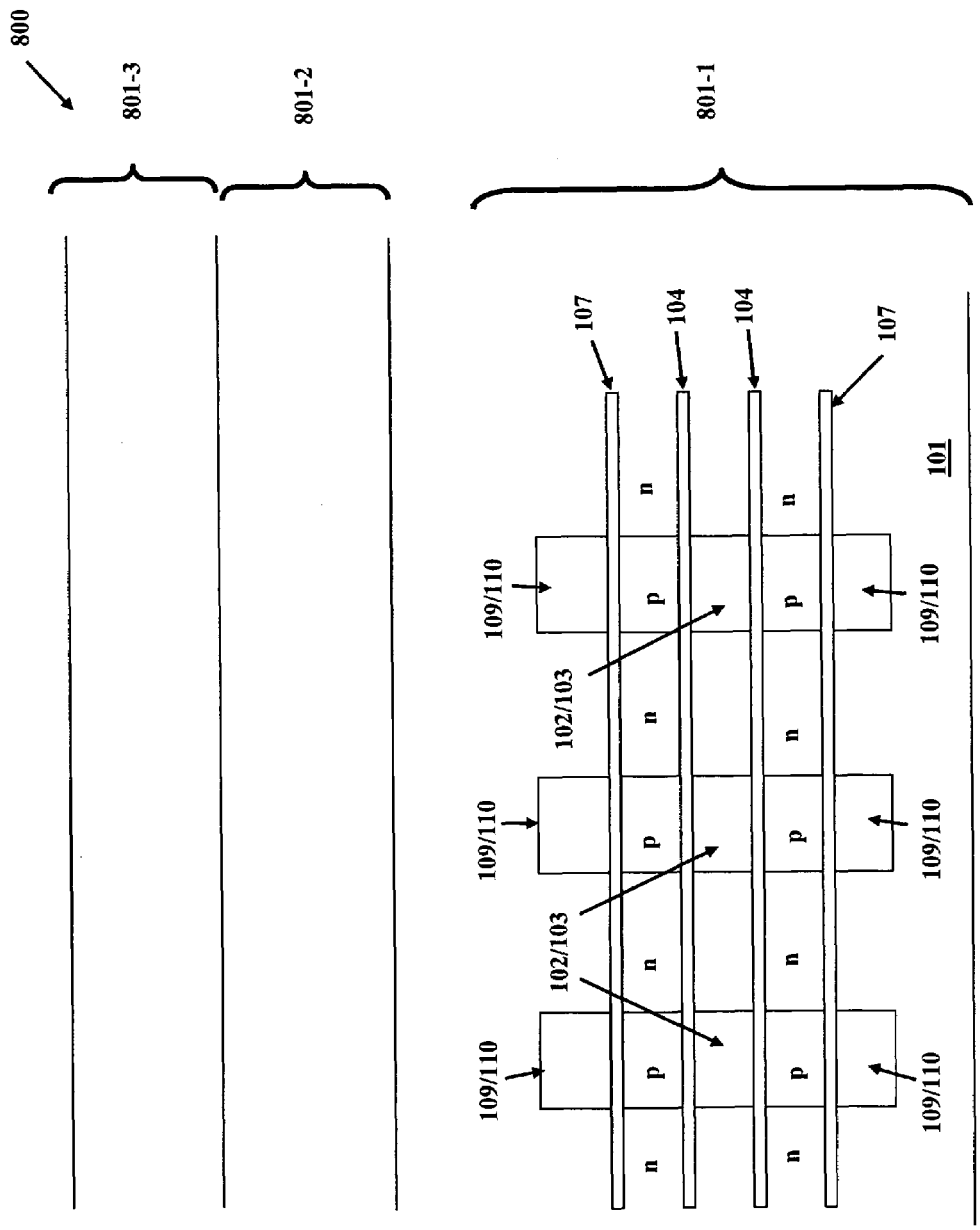
FIG. 8 shows structure 800 which includes non-charge storing intended gate dielectric layers 104 on both sides of gate electrode layer 102/103 (i.e., using the same gate electrode to control more than one access device).
Figure 9:
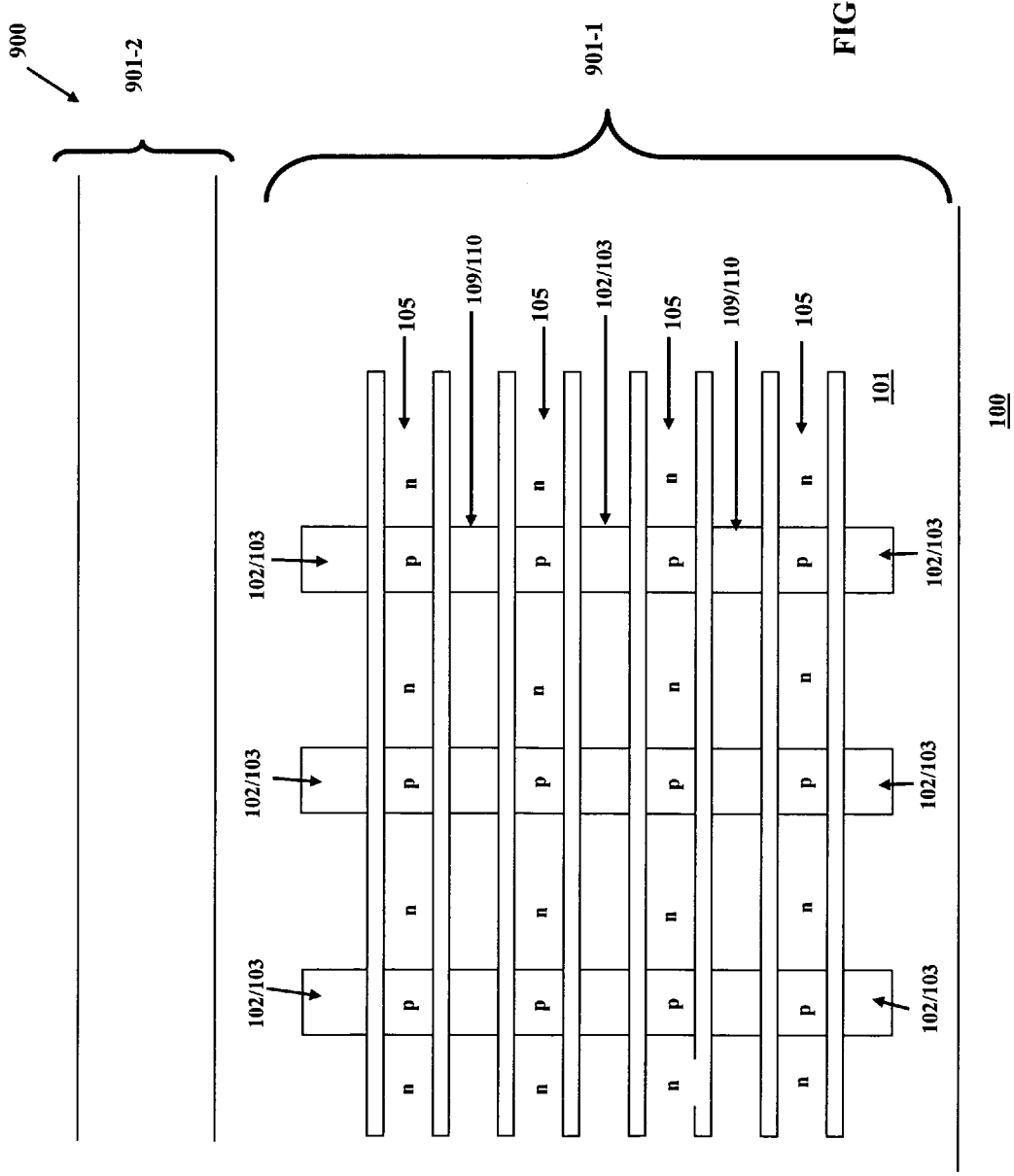
FIG. 9 shows structure 900 which includes variations of the approaches provided in the structures of FIGS. 6-8.

Based on the teachings above, very high density semiconductor devices may be formed by repetitive structures of the dual-gate devices discussed above, as already illustrated by structure 600 in FIG. 6. FIGS. 7-9 show additional dual-gate device structures which may be stacked in a repetitive manner to achieve a high circuit density. Specifically, FIG. 7 shows structure 700 which includes charge storing gate dielectric layers 107 on both sides of gate electrode layer 109/110 (i.e., using the same gate electrode to control more than one memory device). FIG. 8 shows structure 800 which includes non-charge storing gate dielectric layers 104 on both sides of gate electrode layer 102/103 (i.e., using the same gate electrode to control more than one access device). FIG. 9 shows structure 900 which includes variations of the approaches provided in the structures of FIGS. 6-8.

The above detailed description is provided to illustrate the specific embodiments of the present invention disclosed herein and is not intended to be limiting. Numerous variations and modifications of the present invention are possible within the scope of the present invention. The present invention is set forth in the accompanying claims.

We claim:

1. A method for providing a dual-gate semiconductor device, comprising:
   providing a first insulating layer over a semiconductor substrate;
   forming a first gate electrode structure over the insulating layer;
   forming a first dielectric layer over the first gate electrode structure;
   forming a semiconductor layer over the first dielectric layer, such that the first gate electrode structure, the first dielectric layer and a portion of a surface of the semiconductor layer form a first semiconductor device;
   forming a second dielectric layer over the semiconductor layer; and
   forming a second gate electrode structure over the second dielectric layer, such that the second gate electrode structure, the second dielectric layer and a portion of a surface of the semiconductor layer form a second semiconductor device, and such that the first and second semiconductor devices are sufficiently isolated from each other from electrostatically interacting.

2. A method as in claim 1, further comprising forming source-drain regions in the semiconductor layer.

3. A method as in claim 1, wherein a plurality of dual-gate semiconductor devices are formed in the semiconductor layer, the method further comprising interconnecting the semiconductor dual-gate devices in the semiconductor substrate to the dual-gate semiconductor device formed by said first and second gate electrode structures.

4. A method as in claim 1, wherein the second dielectric layer is provided a charge-storing layer.

5. A method as in claim 4, wherein the charge-storing layer includes a layer selected from the group consisting of a nitride layer, a nano-crystal layer, a ferroelectric material, and an oxide-nitride-oxide composite layer.

6. A method as in claim 1, wherein the second dielectric layer includes a dielectric layer in which a floating gate is embedded.

7. A method as in claim 1, wherein the semiconductor layer comprises a polycrystalline material.

8. A method as in claim 7, wherein the polycrystalline material comprises polysilicon.

9. A method as in claim 1, wherein the semiconductor layer comprises an amorphous semiconductor material.

10. A method as in claim 9, further comprising crystallizing the amorphous semiconductor material to form a polycrystalline semiconductor material.

11. A method as in claim 10, wherein crystallizing comprises treating the amorphous semiconductor material using a method selected from the group of heat treatment and laser treatment.

12. A method as in claim 1, wherein one or more of providing the first gate electrode structure, providing the first dielectric layer, providing the semiconductor layer, and providing the second dielectric layer are repeated to provide multiple layers of the first and second semiconductor devices.

13. A method as in claim 1 further comprising providing vias for interconnecting to the first gate electrode structure and the second gate electrode structure.

14. A method as in claim 2, further comprising providing vias for interconnecting to the first gate electrode structure, the source-drain regions and the second gate electrode structure.

15. A method as in claim 14, wherein providing the vias are provided using a single etching step.

16. A method as in claim 1, wherein the first gate electrode structure comprises a conductive silicon layer and a conductor layer.

* * * * *